(12) United States Patent
Cui

(10) Patent No.: US 6,936,843 B2
(45) Date of Patent: Aug. 30, 2005

(54) FIXTURE USED TO PREPARE SEMICONDUCTOR SPECIMENS FOR FILM ADHESION TESTING

(75) Inventor: Zhenjiang Cui, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 57 days.

(21) Appl. No.: 10/883,284

(22) Filed: Jun. 30, 2004

(65) Prior Publication Data

US 2004/0238127 A1 Dec. 2, 2004

Related U.S. Application Data

(60) Division of application No. 10/629,071, filed on Jul. 28, 2003, now Pat. No. 6,790,707, which is a continuation-in-part of application No. 10/435,306, filed on May 9, 2003, now abandoned.

(51) Int. Cl.[7] .............................................. H01L 23/58
(52) U.S. Cl. ........................... 257/48; 438/48; 257/350
(58) Field of Search .................. 257/48, 350; 438/455, 438/48

(56) References Cited

U.S. PATENT DOCUMENTS 5,804,466 A * 9/1998 Arao et al. .................... 438/95
6,486,514 B2 * 11/2002 Jeong et al. ................... 257/72
6,506,664 B1 * 1/2003 Beyne et al. ................. 438/455
6,716,660 B2 * 4/2004 Jeong et al. ................... 438/48
6,730,997 B2 * 5/2004 Beyne et al. ................. 257/698

OTHER PUBLICATIONS

R. H. Dauskardt et al., "Adhesion and Debonding of Multi-Layer Thin Film Structures", *Engineering Fracture Mechanics*, 61(1), pp. 141–162 (1998);.
M. Lane et al., "Adhesion and Reliability of Copper Interconnects with Ta and TaN Barrier Layers", *J. Mat. Res.*, 15(1), pp. 203–211 (2000).
Q. Ma et al., "Quantitative Measurement of Interface Fracture Energy in Multi-Layer Thin Film Structures", *Proceedings of MRS Annual Meeting*, San Francisco, CA, pp. 3–14 and 91–96 (1995).

* cited by examiner

Primary Examiner—John F. Niebling
Assistant Examiner—Andre' Stevenson
(74) Attorney, Agent, or Firm—Shirley L. Church (57) ABSTRACT

The present disclosure pertains to a method of preparing a test specimen for testing of the bonding strength of a layer of additive material to a crystalline substrate, or testing of the bonding strength of one layer of additive material to a second layer of additive material, where both layers of additive material overlie a crystalline substrate. The method includes both test specimen "cutting" from a large sample of material and preparation of an individual test specimen for four-point adhesion testing. Also described is a fixture which is useful for cutting the individual test specimen from the large sample of material.

7 Claims, 6 Drawing Sheets

FIXTURE USED TO PREPARE SEMICONDUCTOR SPECIMENS FOR FILM ADHESION TESTING

RELATED APPLICATIONS

This application is a divisional of U.S. Application Ser. No. 10/629,071, filed Jul. 28, 2003 now U.S. Pat. No. 6,790,707, which is a continuation-in-part of U.S. application Ser. No. 10/435,306, filed May 9, 2003, which is abandoned.

FIELD OF THE INVENTION

The present invention pertains to a method of preparing a test specimen for testing of the bonding strength of a layer of additive material to a crystalline substrate, or testing of the bonding strength of one layer of additive material to a second layer of additive material, where both layers of additive material overlie a crystalline substrate.

BRIEF DESCRIPTION OF THE BACKGROUND ART

The manufacture of semiconductor devices typically involves the deposition of layers of additive material (i.e., thin films) on a crystalline semiconductor substrate, such as single-crystal silicon or gallium arsenide. Adhesion of the layers of additive material to each other and to the semiconductor substrate is very important, because delamination of any one of the layers can lead to device failure. Therefore, the bonding strength of the various layers of additive material to each other and to the semiconductor substrate is critical, and testing is carried out as a part of manufacturing process development and quality control.

The general concepts of thin film adhesion measurements for multi-layered thin film structures have been described in several papers. See, for example, "Adhesion and Debonding of Multi-Layer Thin Film Structures", R. H. Dauskardt et al., *Engineering Fracture Mechanics*, 61(1), pp. 141–162 (1998); "Quantitative Measurement of Interface Fracture Energy in Multi-Layer Thin Film Structures", Q. Ma et al., *Proceedings of MRS Annual Meeting*, San Francisco, Calif., pp. 3–14 and 91–96 (1995); and "Adhesion and Reliability of Copper Interconnects with Ta and TaN Barrier Layers", M. Lane et al., *J. Mat. Res.*, 15(1), pp. 203–211 (2000).

With respect to thin films overlying relatively thick crystalline substrates, tile measurement of adhesion energy is primarily concerned with the macroscopic, or effective work of fracture per unit area required to separate an interface of interest. This may be quantified in terms of the critical strain energy release rate (debonding energy), $G_c$ (typically in $J/m^2$), which is a function of material properties, such as tile interfacial chemistry, adjacent microstructures, and elastic-plastic stress-strain behavior. $G_c$ is also a function of mechanical properties, such as the loading mode mixity near to the debond tip (the ratio of shear to normal stresses). Other design parameters, including the surface morphology (roughness) and the thickness of adjacent thin film layers, may also have an important effect on adhesion.

The interface fracture resistance during debonding essentially depends upon two different energy absorbing processes. These are $G_o$ the near-tip work of fracture, and the energy dissipation which occurs in a zone surrounding the debond. In a region close to the debond crack tip, the intrinsic near-tip work of fracture $G_o$ provides a direct measure of the fracture process at the interface. Factors which contribute to $G_o$ include chemical bonding parameters from across the bond interface and/or micromechanical processes associated with the fracture mechanism.

Alternatively, in some instances, depending on the structure being tested, an energy dissipation zone appears due to factors such as the plasticity of adjacent ductile layers and the interaction of the debond faces behind the debond tip, $G_{zone}$. Interaction mechanism may involve frictional sliding of uneven contacting surfaces and even plastic stretching of unbroken ligaments across the fracture surfaces. Since these energy dissipation mechanisms typically act behind the debond crack tip, their effect increases with initial debond extension, until a steady-state interface fracture resistance is achieved. While such resistance curve behavior is often observed during interface failure, due to the scale of thin film structures, experimental detection of these effects is difficult and generally precluded. As a result, what is finally measured is:

$$G_c = G_o + G_{zone} \text{ (units: } J/m^2\text{)}.$$

A significant limitation of many thin film adhesion measurement techniques, such as the peel test, blister test, indentation test, is that during debonding, residual stresses in the thin film relax and modify the measured adhesion energy. The effects of such relaxation on the measured adhesion values call be large, and although such effects can mathematically be included in an analysis, it is frequently difficult to accurately measure residual film stress of a very thin film present on a rigid substrate.

Thin film stress relaxation can be significantly reduced by preparing a sandwich structure where two pieces of the thin film on a rigid substrate are bonded together with the thin film being tested in the center of the sandwich. A small contribution to tile measured value of $G_c$ will arise from elastic curvature of one of the rigid substrates supporting the thin film after debonding. However, the contribution of this effect to the debond driving energy has been shown to be minimal. Another advantage of the sandwiched sample configuration is the enablement of fracture mechanics-based tests to indicate the characteristics of subcritical debond-growth rate behavior which is associated with environmentally assisted or fatigue processes.

Figure 1:
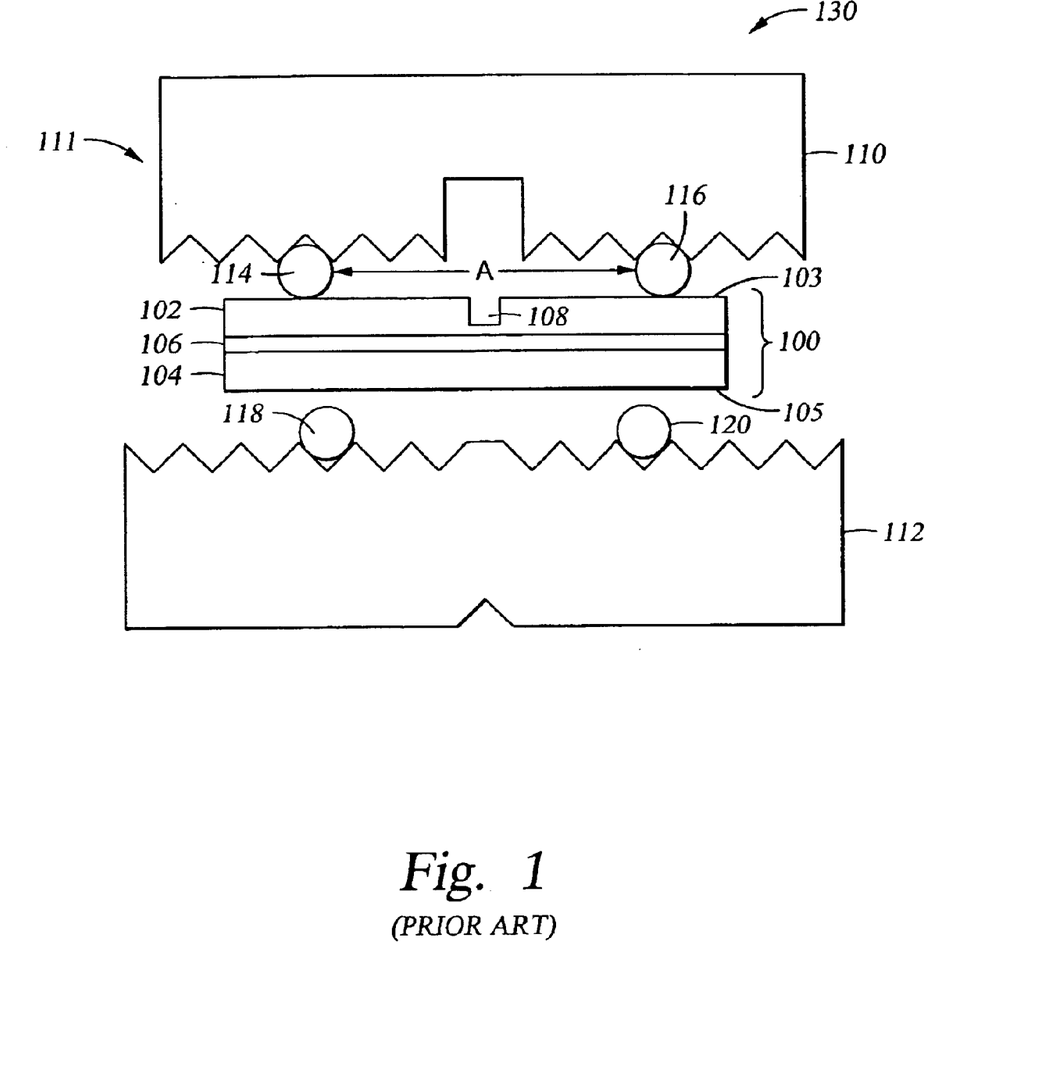
FIG. 1 shows a schematic side view of all assembly 130 used in a four-point adhesion test. Test specimen 100 is placed between four dowel pins (114, 116, 118, 120) which are present between bending fixture 111 members 110 and 112.

A commonly used adhesion test in the semiconductor industry is the four-point (bending) adhesion test. Apparatus for performing the four-point adhesion test is available, for example, from Dauskardt Technical Services (Menlo Park, Calif.). Referring to FIG. 1, which is a schematic top view of all assembly 130 used to perform the four-point adhesion test, a test specimen 100 is placed between dowel pins (114, 116, 118, 120) within bending fixture 111 members 110 and 112. The length of lest specimen 100 must be longer than the distance A between dowels 114 and 116, and typically ranges from about 30 mm to about 50 mm. Sandwich test specimen 100 consists of two semiconductor structures (102 and 104), each having a length of about 40 mm, a width of about 5 mm, and a thickness of about 0.8 mm. The two semiconductor structures have been sandwiched together, face-to-face, and bonded with a layer 106 of an epoxy adhesive in the middle of the sandwich. Typically, the epoxy adhesive layer thickness is about 5 μm to about 20 μm; however, depending on the clamping pressure placed on the sample during cure of the epoxy adhesive, the bonding layer may be as thin as about 2 μm. Bonding time and temperature and general sample preparation techniques are typically provided by the supplier of the epoxy adhesive. Higher bond temperatures and longer times within the specifications of tile manufacturer's recommended process generally produce stronger bonds.

After bonding of the sandwich test specimen 100, the exposed surfaces 103 and 105 of the sandwich test specimen 100 are typically a highly crystalline material, such as single crystal silicon or gallium arsenide. The upper surface 103 shown in FIG. 1 is then notched or grooved in a straight line across the entire width of the surface 103, from edge to edge. A notch (shown in FIG. 4D, for example) or a groove is typically cut into semiconductor structure 102 using a diamond saw. The notch or groove 108 is typically formed to have a maximum depth of about 500 μm into the surface 103 of semiconductor structure 102. Since the crystalline substrate material typically has a thickness of about 700 μm, about 200 μm of thickness of the crystalline substrate material remains overlying the thin film which is to be tested for adhesion to the crystalline substrate, for example.

Figure 2:
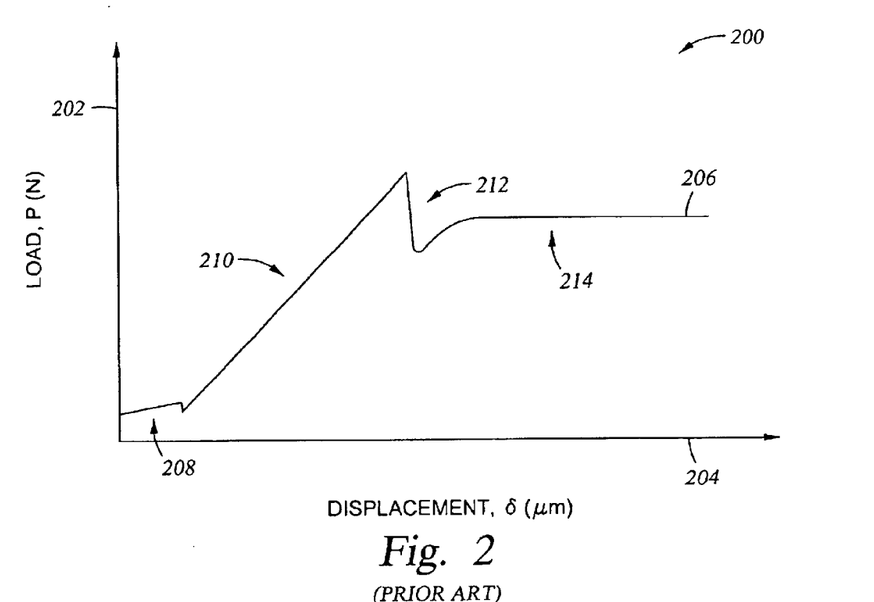
FIG. 2 is a graph 200 showing a schematic illustration of a load displacement curve 206 of the kind obtained during a four-point adhesion test.

The adhesion test is performed by applying a load to test fixture 111 at a constant displacement rate (about 0.01–0.5 μm/sec) to bend the test specimen 100, while carefully observing a load-displacement curve generated by the load cell which has a chassis and a piezo-electric actuator. A schematic illustration of a load-displacement curve is shown in FIG. 2, which is a graph 200 showing load (on tile vertical axis 202) versus displacement (on the horizontal axis 204). Region 208 of curve 206 shows slack being taken Lip in the loading system; region 210 shows linear elastic loading of the test specimen; region 212 shows the initiation of debonding at the notch formed in the test specimen; and region 214 shows debonding extending along the interface.

Figure 3:
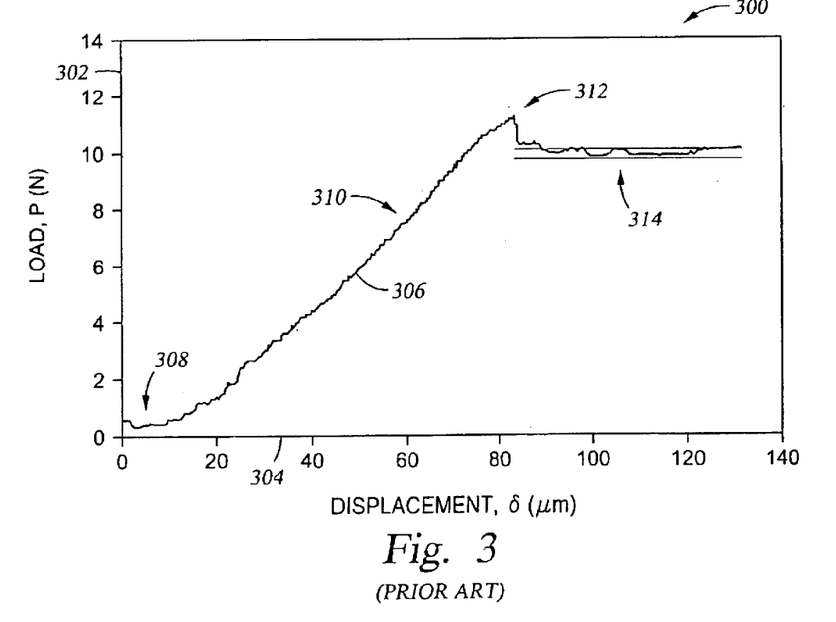
FIG. 3 is a graph 300 showing an actual load-displacement curve 306 obtained during a four-point adhesion test of an Al/TiN/SiO$_2$ interface structure.

FIG. 3 is a graph 300 showing actual test data obtained during a four-point adhesion test of an $Al/TiN/SiO_2$ interface structure. Region 308 of curve 306 shows a vertical pie-crack being formed; region 310 shows tile system behaving linear elastically with no debond extension; region 312 shows a crack kinking into the interface of interest; and region 314 shows the load plateauing at a constant displacement rate of 0.05 μm/sec.

The following equation is used to calculate the interface fracture energy:

$$G_c = \frac{21(1-v^2)P_c^2 L^2}{16Eb^2 h^3}$$

where v is Poisson's ratio for the crystalline substrate; L is the distance between the inner and outer dowel pins; E is the elastic modulus of tile substrate; b is the width of the beam; h is the half height of the beam (half of the height B of specimen 100 shown in FIG. 1), and $P_c$ is the plateau load.

Figure 4A:
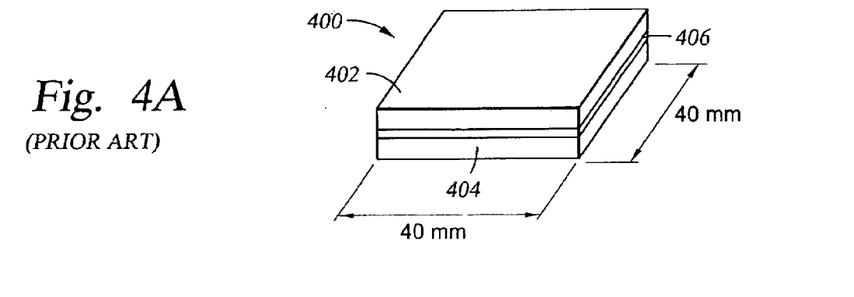
FIG. 4A shows a perspective side view of a bonded structure 400 consisting of two semiconductor structures (402, 404) sandwiched together face-to-face and bonded with a layer 406 of an adhesive.

Test specimens for four-point adhesion testing (such as test specimen 100 shown in FIG. 1) are traditionally prepared according to the method depicted in FIGS. 4A through 4D. Referring to FIG. 4A, two sections, 402 and 404, of a semiconductor structure to be evaluated are bonded together face-to-face using an adhesive, to form the combined structure illustrated. Semiconductor structure sections 402 and 404 have equal dimensions (in this case, 40 mm×40 mm). The semiconductor structure typically consists of a crystalline substrate (such as single-crystal silicon or gallium arsenide) with at least one overlying layer of a additive material (not shown) in the form of a thin film (or films) of an additive material (or additive materials) which is (are) different from the substrate material. When semiconductor structure sections 402 and 404 are bonded, they are bonded with the more crystalline substrate side of each semiconductor-structure facing outward.

Figure 4B:
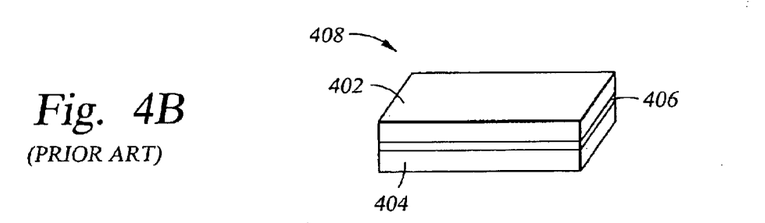
FIG. 4B shows a perspective-side view of a test specimen 408 which has been prepared by dicing of the bonded structure 400 to the desired dimensions using a diamond cutting saw.
Figure 4C:
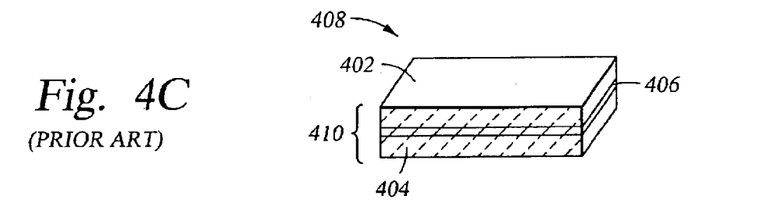
FIG. 4C shows a perspective side view of the test specimen 408 of FIG. 4B after polishing of the side edge of the test specimen.

Following curing of the adhesive, the bonded structure 400 (shown in FIG. 4A) is diced, typically using a diamond saw, into test specimens 408 having the desired dimensions (in this case, 5 mm×40 mm), as shown in FIG. 4B. Following dicing, the side edge 410 of the test specimen 408 must be polished in order to eliminate defects from the side edge of the test specimen. If the side edge of the test specimen includes any stress-inducing defects, the test specimen will break almost immediately when load is applied during the performance of the four-point adhesion test, providing no meaningful adhesion data. To reduce the probability that stress-inducing defects are present on the side edges of the sawed test specimen, the side edges are polished, as illustrated in FIG. 4C. Polishing is typically performed using sand papers, going from coarse to fine, where a liquid may be used in contact with the specimen surface, to protect the surface being polished and to dissipate the heat generated during polishing. Typically, the liquid is water or alcohol. The surface roughness of the polished surface is controlled normally to be less than 5 μm.

Figure 4D:
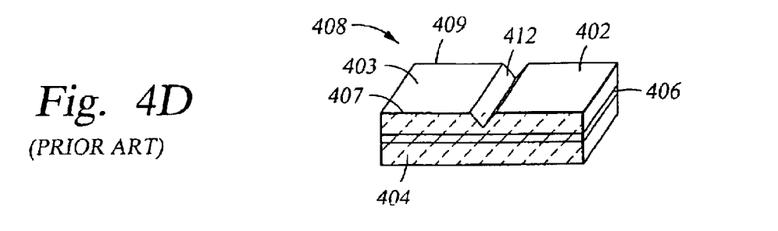
FIG. 4D shows a perspective side view of the test specimen 408 of FIG. 4C after cutting of a notch 412 in test specimen 408 using a diamond saw. The notch 412 extends in a straight line across the entire width of test specimen 408, from one long edge 407 to the opposing long edge 409 of test specimen 408. The function of the notch is as breaking point during bending of test specimen 408 during the performance of a four-point adhesion test.

After polishing of the side edges, a notch 412 is cut into the exposed surface of semiconductor structure 402, typically using a diamond saw, as illustrated in FIG. 4D. The notch 412 extends in a straight line across the entire width of test specimen 408, from one long edge 407 to the opposing long edge 409 of test specimen 408. The notch 412 is typically formed to have a depth of about 500 μm into the upper surface 403 of semiconductor structure 402. The function of the notch 412 is as a break point during bending of test specimen 408 during the performance of the four-point adhesion test described above.

In an alternative sample preparation method, each of the two semiconductor structure specimens are initially cut to the desired test specimen size, and then are bonded together in the same manner. The resulting test specimens are then polished and notched, as shown in FIGS. 4C and 4D.

The test specimen preparation methods described above provide consistent results in the four-point adhesion test (typical standard deviation for $G_c$ is less than 0.5). However, these sample preparation methods are very time-consuming. Cutting of the notch to the desired depth and length is a tedious, difficult, and time-consuming step. In addition, polishing of the test specimen side edges prior to performance of the adhesion test is also very time consuming, making the specimens expensive to fabricate and delaying the time by which data may become available. Polishing of the test specimen side edges may also cause film contamination and/or changes in the film-substrate interface.

To make the sample preparation method less expensive, and to enable immediate testing for quality control purposes, a reliable, straightforward test specimen preparation method is needed. By reliable it is meant that the test specimens prepared by the new method should provide four-point adhesion test results which are at least as consistent as those obtained using samples prepared according to the traditional sample preparation methods described above.

SUMMARY OF THE INVENTION

We have discovered that it is possible to prepare test specimens for film adhesion testing by breaking a semiconductor substrate in a manner which provides a side edge surface that is smooth and essentially free from defects. This means that it is not necessary to polish the side edges of a test specimen made using this breaking technique. The test specimen is prepared from a sandwich structure. The sandwich structure is prepared by bonding together two sections of semiconductor substrate. Each section of semiconductor substrate includes a layer of single crystal material (or a highly crystalline material which approaches a single crystal) having at least one layer of a thin film (additive material) overlying the layer of single crystal material. The sandwich structure is prepared by bonding the thin film-covered surfaces of the substrate together, with the single crystal material layer surfaces forming the exterior of the sandwich structure. The top and bottom sections of the sandwich structure must be carefully aligned during bonding so that the single crystal material layers are aligned precisely along a lattice structure which is to be fractured. For a silicon lattice structure, alignment is along the silicon <100> lattice.

To prepare test specimens from the bonded sandwich structure, a scratch or "scribe", about 0.3–1 mm deep, is made. The scribe is made across an edge portion of an exposed upper surface of the top crystalline semiconductor substrate, and extends downward across an exposed side surface of the top crystalline semiconductor substrate, an exposed side surface of the additive thin film(s), and at least a portion of an exposed side surface of the bottom crystalline semiconductor substrate. Further, the scribe is in a direction perpendicular to a crystalline lattice direction of the substrate. For a silicon substrate, the scribe is perpendicular to tile silicon <100> crystal lattice.

The scribe acts as a fracture-inducing line which will introduce breakage along the silicon <010> crystal orientation, providing a side surface on the broken substrate that is smooth and essentially free of defects. Typically, a plurality of test specimens will be prepared from a single sandwich structure. A series of scribe and break operations are carried out to produce the plurality of test specimens. A diamond scribe or other small hand tool is typically used to form the scribe lines. This techniques can be used to "cut" test specimens to the desired size for four-point adhesion testing. Because the technique provides a smooth, defect-free surface, there is no need for an additional polishing step to remove defects and excess adhesive from the side edge of the test specimens.

We have also discovered that it is possible to prepare the individual test specimens described above for four-point film adhesion testing by scratching or scribing a line over the surface across the entire width of the test specimen, including over/through the side edge corner (but not continuing down the side edge of the "sandwich" structure), rather than machining a groove or notch into the test specimen surface. The scribe must be formed to a depth of about 0.3% to about 10% of the thickness of the single crystal layer which forms the exterior surface of the test specimen. The scribing technique provides a break point for adhesion testing, eliminating the need to form a deep notch or groove in the test specimen prior to adhesion testing.

Disclosed herein is a method of preparing a sample of a semiconductor stricture for adhesion testing. According to the method, a first semiconductor structure is provided which comprises at least one layer of additive material overlying a crystalline semiconductor substrate. The layer of additive material is a different material than the crystalline substrate. The additive material can be any material which is used in the manufacture of semiconductor devices, and is typically a metal, a metal nitride, a metal oxide, a silicon-containing material, or an organic material.

A second semiconductor structure is then provided which comprises a crystalline semiconductor substrate. The second semiconductor structure preferably has the same structure as the first semiconductor structure, but may be just a crystalline semiconductor substrate with no overlying layer(s). Typically, both semiconductor structures are taken from the same substrate source, such as the same semiconductor wafer. An adhesive (typically, an epoxy adhesive) is provided on an exposed surface of the additive material layer (on either the first or second semiconductor structure, or both). The first semiconductor structure and the second semiconductor structure are then aligned so that the exposed surface of the additive material layer of the first structure is facing the exposed surface of the other semiconductor structure. If the second semiconductor structure includes an additive material layer, the two semiconductor structures are aligned so that the exposed surface of the additive material layer of one structure is facing the exposed surface of the additive material layer of the other structure, with the adhesive between the additive material layers. Further alignment of the two structures is performed so that the crystal lattice orientation of both semiconductor structures are the same. This is necessary so that when a force is applied, the load transfers evenly and the single crystal substrate which is scribed will break along crystalline lattice boundaries.

The adhesive is then cured, to form a bonded sandwich structure. A first scribe is then made at an edge of an exposed surface of a single crystal layer of the substrate as previously described. The bonded sandwich structure is then broken along the crystalline lattice on which the scribe lies. A plurality of such scribes is typically made and, after each scribe, the bonded structure is broken along a crystalline boundary. After a number of scribe/break procedures, test specimens of a nominal size are obtained.

A test specimen is then scribed for the four-point adhesion test. A testing scribe is made which extends in a straight line across the width of each test specimen, as previously described, from one long edge of the test specimen to the opposing long edge or the test specimen. The testing scribe is then used as a break point during the performance of four-point adhesion testing on the test specimen.

The sample preparation method disclosed herein eliminates the time-consuming polishing and notching steps required in the traditional sample preparation method. By eliminating these sample preparation steps, the present method reduces sample preparation time to about 10% of that needed for the traditional sample preparation method. Four-point adhesion testing of samples prepared using the method described herein provided data which is as consistent as that obtained using samples prepared according to the traditional sample preparation method. The present method is also more useful in terms of providing data more rapidly, so that on-line process problems can be detected and solved earlier.

DETAILED DESCRIPTION OF THE INVENTION

As a preface to the detailed description, it should be noted that, as used in this specification and the appended claims, the singular form "a", "an", and "the" include plural referents, unless the context clearly dictates otherwise. When the term metal or metallic is used, it is understood that this includes metal alloys. Other terms important to an understanding of the invention are defined in context throughout the application.

For purposes of illustration, the sample preparation method is described below with reference to FIGS. 5A–5G.

Figure 5A:
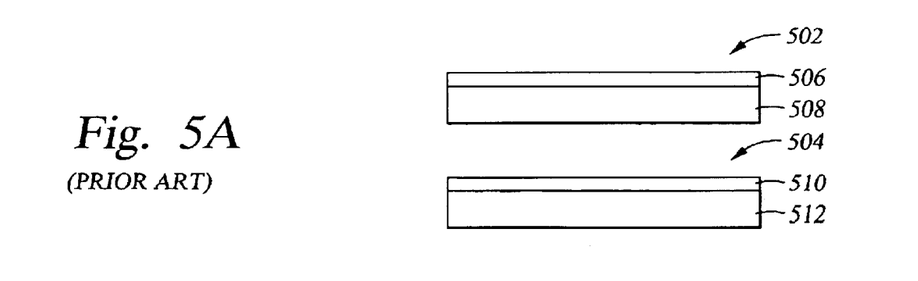
FIG. 5A shows a schematic cross-sectional side view of a first semiconductor structure 502 and a second semiconductor structure 504 which are used to prepare test specimens for four-point adhesion testing according to the method of the invention. First semiconductor structure 502 consists of a layer 506 of an additive material overlying a crystalline substrate 508. Second semiconductor structure 504 also consists of a layer 510 of an additive material overlying a crystalline substrate 512.

FIG. 5A shows a cross-sectional side view of a first semiconductor structure 502 and a second semiconductor structure 504 which are used to prepare test specimens for four-point adhesion testing according to the method of the invention. First semiconductor structure 502 consists of a layer 506 of an additive material overlying a crystalline substrate 508. Second semiconductor structure 504 has the same structure as the first semiconductor structure 502. Second semiconductor structure 504 consists of a layer 510 of an additive material overlying a crystalline substrate 512.

The crystalline substrate (508, 512) is typically silicon or gallium arsenide, but may be any other material which has a crystalline structure which allows the material to be broken along crystalline boundaries. Crystalline substrates 508 and 512 should be the same material.

The layer of additive material (506, 510) is a different additive material than tile crystalline substrate (508, 512). The additive material is typically a metal (such as aluminum, copper, platinum, iridium, ruthenium, titanium, tantalum, or tungsten); a metal nitride (such as titanium nitride, tantalum nitride, or tungsten nitride); a metal oxide (such as aluminum oxide, iridium oxide, or ruthenium oxide); a silicon-containing material (such as polysilicon, silicon oxide, silicon nitride, silicon oxynitride, or silicon carbide); or an organic material, for example, and not by way of limitation. The method is not intended to be limited to only the additive materials listed above, but is intended to encompass any additive material which is useful in semiconductor device applications.

The additive material layer (506, 510) may be deposited onto the crystalline substrate (508, 512) using any of the standard deposition techniques known in the art of semiconductor manufacture, such as chemical vapor deposition (CVD), physical vapor deposition (PVD, also known as "sputtering"), and spin-on techniques, for example and not by way of limitation. The additive material layer (506, 510) typically has a thickness of 10 microns or less.

Figure 5B:
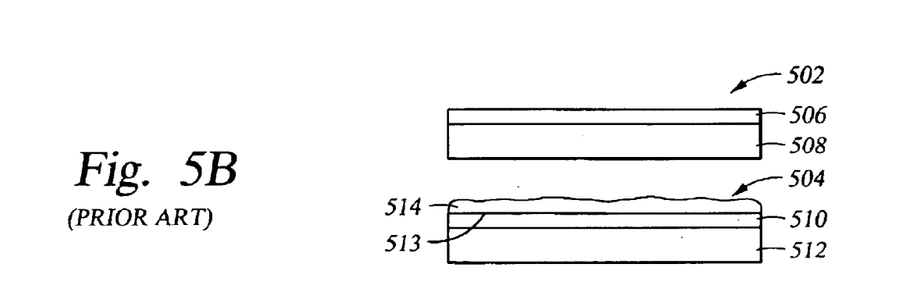
FIG. 5B shows a schematic cross-sectional side view of the first semiconductor structure 502 of FIG. 5A after application of a layer 514 of an epoxy adhesive to a surface 513 of an additive material layer 510.

Referring to FIG. 5B, a layer 514 of an adhesive is applied to additive material layer 510. The adhesive is typically an epoxy adhesive, such as EPO-TEK, available from Epoxy Technology, Inc. (Billerica, Mass.). The adhesive should be selected so that the bond strength of the adhesive to the additive material layer 506 is stronger than the bond strength of the additive material layer 506 to the crystalline substrate

508, in order to provide meaningful four-point adhesion test results. For example, if the additive material layer 506 delaminates from the adhesive layer 514 before the additive material layer 506 delaminates from the substrate 508, it will not be possible to measure the adhesion (i.e., bond strength) of the additive material layer 506 to the substrate 508.

Figure 5C:
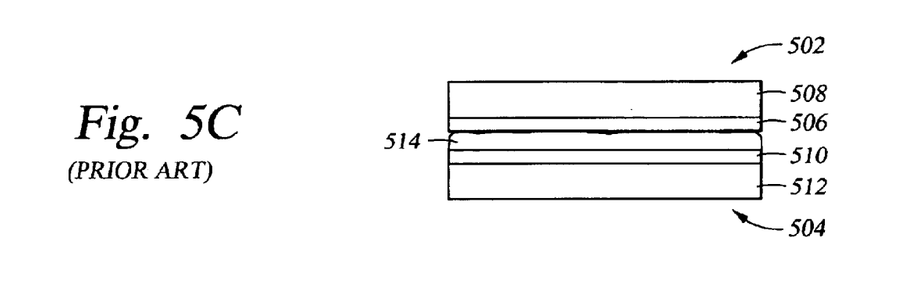
FIG. 5C shows a schematic cross-sectional side view of the first semiconductor structure 502 aligned with second semiconductor structure 504 to form a sandwich structure.

First semiconductor structure 502 and second semiconductor structure 504 are then sandwiched together face-to-face, with the layer 514 of epoxy adhesive between the two structures, as shown in FIG. 5C. The substrate (508, 512) side of each structure faces outward. The two structures must be aligned such that the single crystal material layers are aligned precisely along the silicon <100> crystal lattice structure, so that, when broken, the crystalline substrates will crack and separate along crystalline boundaries, providing a smooth, defect-free side edge surface. The two structures are typically clamped to each other or held together using other means to inhibit movement during the curing step.

Figure 5D:
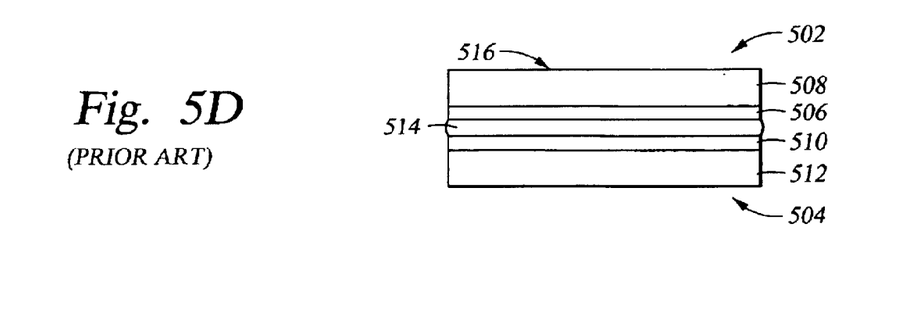
FIG. 5D shows a schematic cross-sectional side view of the first semiconductor structure 502 bonded by epoxy adhesive layer 514 to second semiconductor structure 504, after curing of the epoxy adhesive. Additive material layer 506 of first semiconductor structure 502 is bonded to additive material layer 510 of second semiconductor structure 504. Crystalline substrates 508 and 512 form the upper and lower major surfaces of the bonded sandwich structure 516.

The epoxy adhesive layer 514 is then cured by placing the structure shown in FIG. 5C in a furnace at a temperature within the range of about 80° C. to about 250° C., for a time period within the range of about 15 minutes (at 250° C.) to about 2 hours (at 80° C.). FIG. 5D shows a cross-sectional side view of the bonded sandwich structure 516 formed after cuing of epoxy adhesive layer 514. Additive material layer 506 of first semiconductor structure 502 is bonded to additive material layer 510 of second semiconductor structure 504.

Figure 5E:
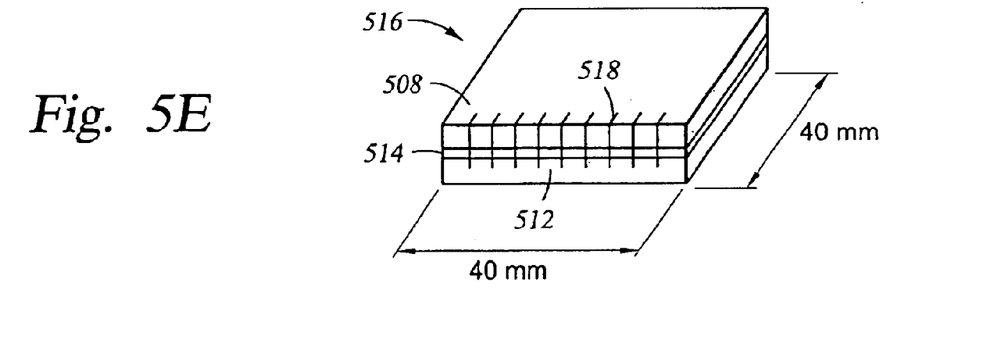
FIG. 5E shows a perspective side view of the bonded sandwich structure 516 of FIG. 5D after formation of a series of scribes 518 at an edge of an exposed surface of crystalline substrate 508. The scribes are used to break bonded structure 516 into a plurality of samples for adhesion testing.

To prepare test specimens from the bonded sandwich structure 516, a scratch or "scribe" is made across an edge portion of an exposed upper surface of the top crystalline semiconductor substrate, and extends downward across an exposed side surface of the top crystalline semiconductor substrate, an exposed side surface of the additive thin film(s), and a portion of an exposed side surface of the bottom crystalline semiconductor substrate (as shown in FIG. 5E). The scribe for breaking must cross the side edge surface of the thin film (additive material layer) adhered to the single crystal material layer. Further, the direction of tile scribe is in a direction perpendicular to a crystalline lattice direction in a single crystal structure of the substrate. For a silicon substrate, the scribe is perpendicular to the silicon <100> crystal orientation. The scribe is formed to a depth of about 0.3% to about 10% of the substrate thickness, typically using a diamond scribe or other small hand tool. For most applications, the scribe will be about 0.3 mm to about 1 mm deep.

FIG. 5E shows a perspective side view of bonded sandwich structure 516 after scribing. By way of example, bonded structure 516 is shown with seven lines 518, each representing a location at which a scribe will eventually be made into the surface of crystalline substrate 508 during the scribe/break procedure. The 40-mm wide bonded structure 516 shown in FIG. 5E can be used to prepare six 5-mm wide test specimens. The two end pieces will typically not be used for testing, because they will contain excess adhesive along one of the side edges. If desired, excess adhesive can be removed from the side edges of the end pieces by scraping the side edges with a knife or razor blade, prior to and after curing of the adhesive, in order to maximize the number of test specimens which can be obtained from one bonded sandwich structure.

The bonded structure 516 is then broken along a crystalline boundary, guided by an individual scribe, to form test specimens of the desired size. For a silicon substrate, the scribe acts as a fracture-inducing line which will introduce breakage along the silicon <010> crystal orientation. Bonded structure 516 can be broken along a crystalline boundary using a test specimen preparation fixture such as test specimen preparation fixture 600, shown in FIGS. 6C and 6D, which is provided herein as an exemplary fixture (and not by way of limitation of the invention claimed herein). The method of the invention is not intended to be limited to the use of a particular fixture, such as that shown in FIGS. 6C and 6D, but is intended to encompass all other fixtures which operate along similar principles as the test specimen preparation fixture 600 shown in FIGS. 6C and 6D.

Figure 6A:
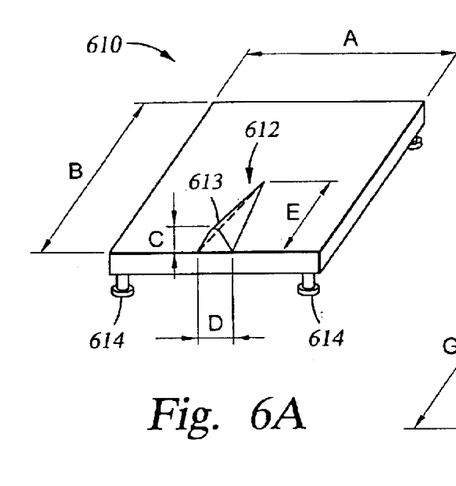
FIG. 6A shows a perspective side view of a bottom portion 610 of a test specimen preparation fixture 600 (shown in FIG. 6C) which can be used to prepare test specimens according to the method of the invention.

FIG. 6A shows a perspective side view of a bottom portion 610 of a test specimen preparation fixture 600 (shown in FIG. 6C) which can be used to prepare test specimens according to the method of the invention. Bottom portion 610 typically has a width A of about 30 mm to about 40 mm, and a length B of about 30 mm to about 40 mm. Bottom portion 610 is supported by (typically adjustable) feet 614, which are typically positioned at each corner of bottom portion 610.

Wedge 612 is used to propagate the break from a scribe across a bonded sandwich structure (such as structure 516, shown in FIG. 5E), for the purpose of preparing test specimens for four-point adhesion testing. (FIGS. 6A–6D are not drawn to scale. Wedge 612 is drawn proportionately larger for illustration purposes.) Wedge 612, which is positioned at the mid-point of one side of bottom portion 610, typically has a height C or about 1 mm to about 2 mm; a width D of about 2 mm; and a length E of about 3 mm to about 4 mm. Wedge 612 is typically made of a hard material, such as a metal or a hard polymer, or a metal coated with a polymer. Wedge 612 has a slightly rounded edge 613 (i.e., edge 613 is not such a sharp angle as to be a "knife edge"). Edge 613 is sufficiently rounded to permit scribe propagation when a bonded sandwich structure is placed on top of bottom portion 610 and wedge 612. Edge 613 typically has a radius of 0.5 mm or less.

Figure 6B:
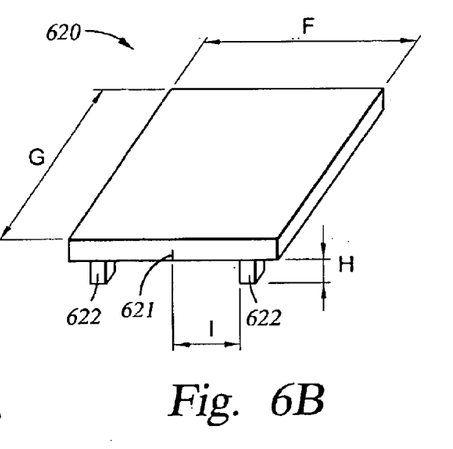
FIG. 6B shows a perspective side view of a representative top portion 620 of a test specimen preparation fixture 600 (shown in FIG. 6C) which can be used to prepare test specimens according to the method of the invention.

FIG. 6B shows a perspective side view of a representative top portion 620 of a test specimen preparation fixture 600 (shown in FIG. 6C) which can be used to prepare test specimens according to the method of the invention. Top portion 620 typically has a width ranging from about 10 mm to about 40 mm, and a length of about 30 mm to about 40 mm.

Blocks 622 are provided at two corners of top portion 620, for the purpose of gripping a bonded sandwich structure while the bonded structure is positioned within the test specimen preparation fixture 600. In order to grip the bonded sandwich structure, the blocks 622 should be made of a slightly tacky (but solid) material or a material which will create friction against the test specimen surface, such as a hard rubber, or a rubber-coated metal or hard polymer. The blocks 622 typically have a height H of about 2 mm to about 5 mm, and are positioned a distance 1 of at least about 5 mm away from the mid-point 621 of one side of top portion 620.

Figure 6C:
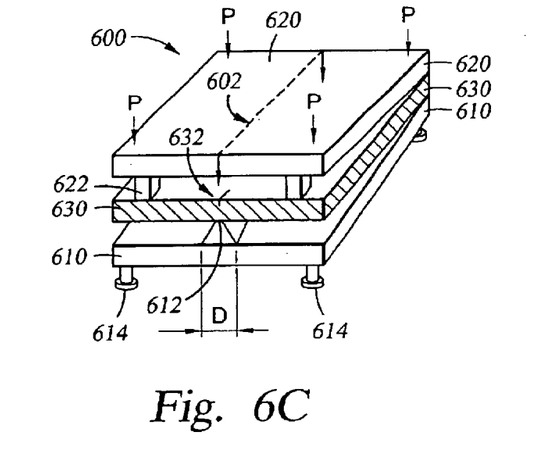
FIG. 6C shows a perspective side view of a test specimen preparation fixture 600 which can be used to prepare test specimens according to the method of the invention. Text specimen preparation fixture 600 consists of a top portion 620 and a bottom portion 610, with a bonded sandwich structure 630 (similar to bonded structure 516, shown in FIG. 5E) positioned between top portion 620 and bottom portion 610.
Figure 6D:
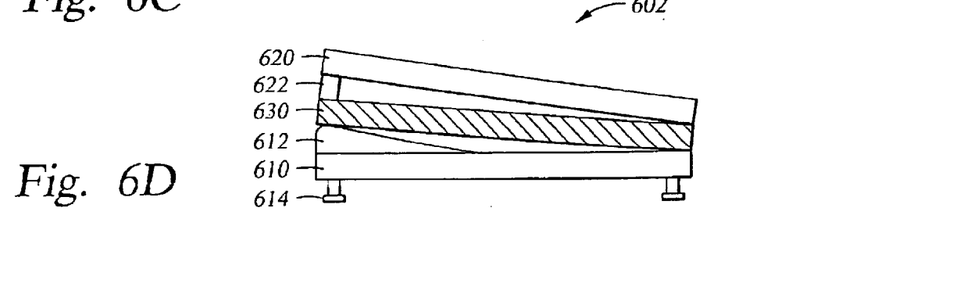
FIG. 6D shows a cross-sectional side view of the test specimen preparation fixture 600 of FIG. 6C, with bonded sandwich structure 630 positioned between top portion 620 and bottom 610 of test specimen preparation fixture 600.

FIG. 6C shows a perspective side view of test specimen preparation fixture 600, with a bonded sandwich structure 630 positioned between top portion 620 and bottom portion 610, for breaking the bonded structure 630 into individual test specimens. FIG. 6D shows a cross-sectional side view of the test specimen preparation fixture 600 of FIG. 6C, with the cross-section taken at mid-line 602 (shown in FIG. 6C) of test specimen preparation fixture 600.

Referring to FIGS. 6C and 6D, bonded structure 630 is positioned above bottom portion 610 such that scribe 632

(shown in FIG. 6C) of bonded structure 630 (shown crosshatched) is aligned with wedge 612 of bottom portion 610. Top portion 620 is placed on top of bonded structure 630, with blocks 622 contacting the outer edges of the top surface of bonded structure 630.

Figure 5F:
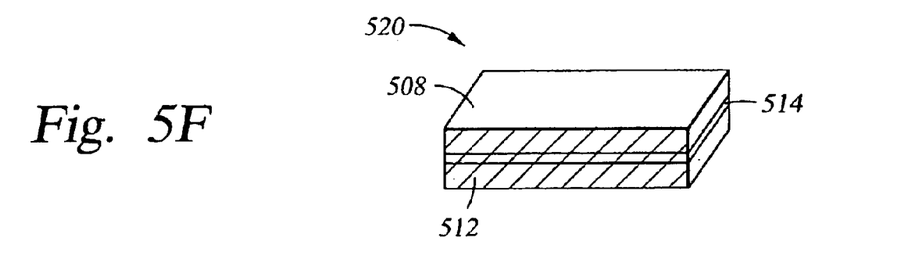
FIG. 5F shows a perspective side view of a test specimen 520 which has been prepared by breaking bonded structure 516 along crystalline boundaries. The breaking of the bonded structure 516 along crystalline boundaries is guided by scribes 518.

To break the bonded structure 630 into test specimens along scribe 632, uniform pressure (P) is applied along all four corners of top portion 620 of test specimen preparation fixture 600. Test specimens for four-point adhesion testing are typically prepared to have a width of either 5 mm or 10 mm, and a length within the range of about 30 mm to about 40 mm. The desired test specimen size is determined by the type of specimen testing equipment used. The method disclosed herein is not intended to be limited to the preparation of a particular test specimen size. A test specimen 520 which has been scribed and broken to the desired size is shown in FIG. 5F.

Figure 5G:
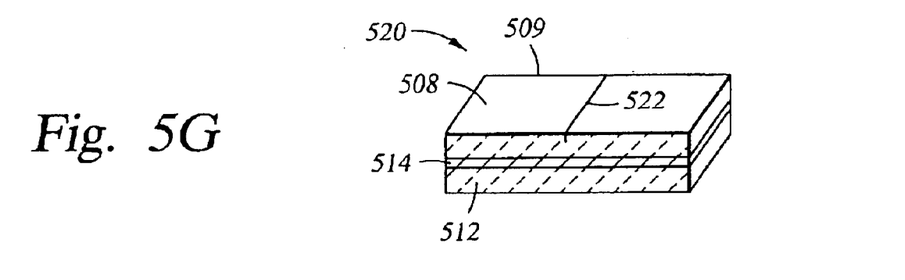
FIG. 5G shows a perspective side view of the test specimen 520 of FIG. 5F after formation of scribe 522 on an exposed surface of a single crystal substrate 508, prior to performance of four-point adhesion testing on test specimen 520. Scribe 522 extends in a straight line across the width of single crystal substrate 508 surface 505, from a first long edge 507 of crystalline substrate 508 to an opposing long edge 509 of single crystal substrate 508.

A scribe 522 is then formed in the exposed surface of crystalline substrate 508, as shown in FIG. 5G. Scribe 522 extends in a straight line, across the width of sample 520, from a first long edge 507 of crystalline substrate 508 to an opposing long edge 509 of crystalline substrate 508. As shown in FIG. 5G, scribe 522 should extend over an edge of crystalline substrate 508, to about 1.3% to about 50%, typically, about 1.3% to about 10%, of the thickness of crystalline substrate 508. Scribe 522 will be used as a break point during performance of four-point adhesion testing on test specimen 520.

Scribe 522 is formed to a depth which is about 0.3t to about 10% of the thickness of crystalline substrate 508, using a diamond scribe or other small hand tool. By contrast, when the traditional sample preparation method is used, the notch or groove must be cut, using a diamond saw, to a depth of about 70% of the thickness of the substrate.

The test specimen 520 is now ready to be used in the four-point adhesion test described in the "Background of the Invention" section. The four-point adhesion test data obtained using samples prepared according to the method disclosed herein has been shown to be as consistent as four-point adhesion test data obtained using samples prepared according to the traditional sample preparation method described in the "Background of tile Invention". Typical standard deviations range from 0.2 to 0.5 for both sample preparation methods.

The sample preparation method disclosed herein eliminates the time-consuming polishing and notching steps required in the traditional sample preparation method. By eliminating these time-consuming sample preparation steps, the present method reduces sample preparation time to about 10% of that needed for the traditional sample preparation method. In addition, the method disclosed herein makes it possible to obtain test data for a process more rapidly, so that testing can be used to ensure quality control as well as to carry out initial development of a new process.

The above-described embodiment is provided to enable one skilled in the art to understand the concepts which are disclosed and claimed herein, and is not intended to limit the scope of the present invention.

We claim:

1. A test specimen preparation fixture used to prepare semiconductor specimens for film adhesion testing, wherein said test specimen preparation fixture comprises:
    a) a base having an upward-facing wedge structure over a portion of an upper surface of said base; and
    b) a cover having downward-facing structures adapted for gripping an upper surface of a test specimen, wherein said downward-facing structures are positioned along an area of said cover which faces said upward-facing wedge structure on said base.

2. The test specimen preparation fixture of claim 1, wherein said base has a width ranging from about 30 mm to about 40 mm, and a length ranging from about 30 mm to about 40 mm.

3. The test specimen preparation fixture of claim 1, wherein said cover has width ranging from about 10 mm to about 40 mm, and a length ranging from about 30 mm to about 40 mm.

4. The test specimen preparation fixture of claim 1, wherein said wedge has a height ranging from about 1 mm to about 2 mm, a width of about 2 mm, and a length ranging from about 3 mm to about 4 mm.

5. The test specimen preparation fixture of claim 4, wherein said wedge has an upper edge radius of 0.5 mm or less.

6. The test specimen preparation fixture of claim 1, wherein said structures adapted for gripping said bonded sandwich structure have a height ranging from about 2 mm to about 5 mm.

7. The test specimen preparation fixture of claim 1, wherein said structures adapted for gripping are at least two structures, and wherein said structures for gripping are spaced apart across the width of said fixture so that gripping structures nearest the lengthwise centerline of said fixture are positioned at least about 5 mm away from said lengthwise centerline of said fixture.

* * * * *